United States Patent
Hines et al.

(10) Patent No.: US 9,874,441 B1
(45) Date of Patent: Jan. 23, 2018

(54) CIRCUITRY AND METHOD FOR REDUCING ECHO WALK ERROR IN A TIME-OF-FLIGHT LASER DISTANCE DEVICE

(71) Applicants: Gail Hines, Tullahoma, TN (US); William L. Goodman, Estill Springs, TN (US); Isaac Lescano, Lima (PE); Patrick J. Murphy, Tullahoma, TN (US); Jonathan Murphy, Tullahoma, TN (US)

(72) Inventors: Robin Hines, Tullahoma, TN (US); William L. Goodman, Estill Springs, TN (US); Isaac Lescano, Lima (PE); Patrick J. Murphy, Tullahoma, TN (US); Jonathan Murphy, Tullahoma, TN (US)

(73) Assignee: OPTI-LOGIC CORPORATION, Tullahoma, TN (US)

( * ) Notice: Subject to any disclaimer, the term of this patent is extended or adjusted under 35 U.S.C. 154(b) by 378 days.

(21) Appl. No.: 14/156,572

(22) Filed: Jan. 16, 2014

Related U.S. Application Data

(60) Provisional application No. 61/753,009, filed on Jan. 16, 2013.

(51) Int. Cl.
  *G01C 3/08* (2006.01)
  *G01C 3/02* (2006.01)
  *H03K 5/08* (2006.01)
  *H03K 5/1534* (2006.01)

(52) U.S. Cl.
  CPC ............... *G01C 3/08* (2013.01); *G01C 3/02* (2013.01); *H03K 5/082* (2013.01); *H03K 5/1534* (2013.01)

(58) Field of Classification Search
  CPC ........ H03K 5/1534; H03K 5/082; G01C 3/02; G01C 3/08
  USPC ........................................................ 356/5.01
  See application file for complete search history.

(56) References Cited

U.S. PATENT DOCUMENTS

| | | |
|---|---|---|
| 3,830,567 A | 8/1974 | Riegl |
| 4,606,629 A | 8/1986 | Hines et al. |
| 4,753,528 A | 6/1988 | Hines et al. |
| 5,291,262 A | 3/1994 | Dunne |
| 5,859,693 A | 1/1999 | Dunne et al. |
| 5,898,484 A | 4/1999 | Harris |

(Continued)

*Primary Examiner* — Mark Hellner
(74) *Attorney, Agent, or Firm* — Patterson Intellectual Property Law, P.C.; Gary L. Montle

(57) ABSTRACT

A time-of-flight laser distance device includes a laser transmitter, a laser pulse return detector to receive reflected laser pulses, and comparators with respective first and second trip levels. A preliminary distance to a target is based on a linear ramp as a function of lapsed time from laser pulse generation through an effective time period wherein an associated return pulse is detected. Time-of-flight values associated with a leading edge of the return pulse are obtained at each of the first and second trip levels. A time difference is determined between the obtained values, and a correction factor is applied with respect to the preliminary measured distance based on the determined time difference. A dual ADC may be used wherein the leading edge of the return pulse is calculated by measuring a slope associated with the time-of-flight values and extrapolating a slope origin to a zero crossing point.

16 Claims, 5 Drawing Sheets

(56) References Cited

U.S. PATENT DOCUMENTS

| | | | |
|---|---|---|---|
| 5,926,260 A * | 7/1999 | Dunne | G01C 3/08 |
| | | | 356/4.01 |
| 5,933,224 A | 8/1999 | Hines et al. | |
| 6,144,308 A | 11/2000 | Dunne | |
| 6,587,187 B2 * | 7/2003 | Watanabe | G01S 7/493 |
| | | | 342/118 |
| 6,873,406 B1 | 3/2005 | Hines et al. | |
| 2005/0094238 A1 | 5/2005 | Kostamovaara et al. | |

* cited by examiner

CIRCUITRY AND METHOD FOR REDUCING ECHO WALK ERROR IN A TIME-OF-FLIGHT LASER DISTANCE DEVICE

A portion of the disclosure of this patent document contains material that is subject to copyright protection. The copyright owner has no objection to the reproduction of the patent document or the patent disclosure, as it appears in the U.S. Patent and Trademark Office patent file or records, but otherwise reserves all copyright rights whatsoever.

CROSS-REFERENCES TO RELATED APPLICATIONS

This application claims benefit of the following patent application(s) which is/are hereby incorporated by reference: U.S. Provisional Application No. 61/753,009, filed Jan. 16, 2013.

BACKGROUND OF THE INVENTION

The present invention relates generally to laser distance devices. More particularly, this invention relates to circuitry and methods associated with reducing walk error and accordingly increasing accuracy and resolution in time-of-flight laser distance devices.

Pulse laser time-of-flight distance measuring instruments are commercially available for use in hunting, golf, forestry and other wide-spread applications. Such instruments or laser rangefinders typically include: a collimated infrared pulsed laser at a nominal pulse repetition rate of several hundred Hertz or lower; a receiving photo detector; a circuit to recognize a return pulse from a target; a processing circuit to convert the lapsed time between the transmitted pulse and the received pulse; and a display to show the distance. An exemplary such laser rangefinder as is currently known in the art may be as described in U.S. Pat. No. 5,933,224, herein incorporated by reference in its entirety. Although several techniques have been successfully used to measure the time-of-flight, the techniques are generally only as good as their ability to determine the start time at the transmission of the laser pulse and the stop time of the received pulse.

Because the dynamic range of the amplitude of the return pulse is a function of distance, atmosphere attenuation and target reflectivity, a leading edge discriminator using a fixed reference level computer is subject to a walk error $\Delta t$ as defined by Pasi Palojarvi in his dissertation entitled "Integrated Electronic and Optoelectronic Circuits and Devices for Pulses Time-of-Flight Laser Rangefinding." (Oulu 2003).

It is known in the art to implement a single comparator in which the reference level is set above the noise floor, and wherein the comparator goes from high to low logic output when the return pulse is above the reference level. For very strong return pulses such as from a retro-reflector, the leading edge of the return pulse may be very close to the actual return pulse time so that the walk error is minimal. However, for weaker signals the leading edge may be extended to several tens of nanoseconds resulting in a range error of several yards. Increasing the fixed gain for weak signals causes saturation of the photodiode circuits and unacceptable signal-to-noise ratios for selected targets.

An additional problem may further present itself in hand-held laser time-of-flight instruments having a fixed gain and a fixed comparator trip level. With the fixed maximum gain, the laser trigger generates a pulse through the photodiode and trans-impedance amplifier circuits that masks the actual return laser pulse from a nearby target. A proprietary circuit used by the Opti-Logic Corporation has fixed comparator trip levels and a time control gain (or "TGC"). When the initial sequence begins for measuring the distance to a target, the electronic gain is minimal but increases with time over multiple laser transit pulses until a return pulse is detected or the maximum gain is reached. If a return pulse is detected, the TGC is reset to the minimum and the increasing gain sequence repeats. This process continues until enough data are obtained from the return pulses to allow the microprocessor to generate and display a valid distance.

However, because the signal level at which the TGC reaches a valid distance may not yield the optimum leading edge for the return pulse, the walk error may be worse than if the gain were always at a maximum.

Therefore, it would be desirable to provide circuitry and methods for accurately and reliably determining the leading edge of a laser return pulse.

BRIEF SUMMARY OF THE INVENTION

In accordance with various aspects of the present invention, a laser distance device as otherwise known in the art is further provided with exemplary circuits and techniques as further described herein for reducing the walk error.

In one embodiment, a time-of-flight laser distance device includes a laser transmitter for generating laser pulses at a selected target, a laser pulse return detector circuit for receiving corresponding laser pulses reflected from the selected target, and return pulse measurement circuitry including at least first and second comparators with respective first and second trip levels.

A controller calculates a time-of-flight for a received laser pulse, first by measuring a preliminary distance to the target based on a linear ramp as a function of a lapsed time from generation of a first laser pulse through an effective time period wherein an associated return pulse is detected. First and second time-of-flight values associated with a leading edge of the return pulse are obtained at each of the first and second trip levels, respectively. A time difference is determined between the first and second obtained values, and a correction factor is applied with respect to the preliminary measured distance based on the determined time difference.

In another aspect, the return pulse measurement circuitry further includes at least first and second analog-to-digital (ADC) converters corresponding to the at least first and second comparators, respectively, or alternatively may include a dual ADC converter corresponding to the at least first and second comparators, wherein the leading edge of the return pulse is calculated by measuring a slope associated with the first and second time-of-flight values and extrapolating an origin of the slope to a zero crossing point.

In another aspect, the return pulse measurement circuitry further includes timed-gain control (TGC) circuitry for iteratively increasing amplitudes for each return pulse signal level until an upper trip level is obtained, after which a gain value is reset. A third comparator may be provided having a third trip level corresponding to the upper trip level for the TGC circuitry, the third trip level being higher than the first and second trip levels.

In another aspect, the return pulse measurement circuitry further includes gain control circuitry for maintaining return pulse signal levels between a greatest lower bound and a least upper bound. The gain control circuitry may be comprised of an avalanche photodiode, wherein a temperature sensor and avalanche photodiode bias control circuitry maintains a bias voltage across a detected temperature range to make a pulse return detector gain kept substantially constant.

In yet another aspect, the laser distance device may be provided as part of a system having communicatively linked components, wherein data may be distributed and controlled externally with respect to the laser distance device rather than locally generated and displayed.

In yet another aspect, an exemplary device and technique as disclosed herein includes a high pass timing discriminator, automatic gain controls for constant amplitude signals, and a constant fraction discriminator (CFD) in which the timing point is generated by comparing return pulses.

DETAILED DESCRIPTION OF THE INVENTION

Figure 1:
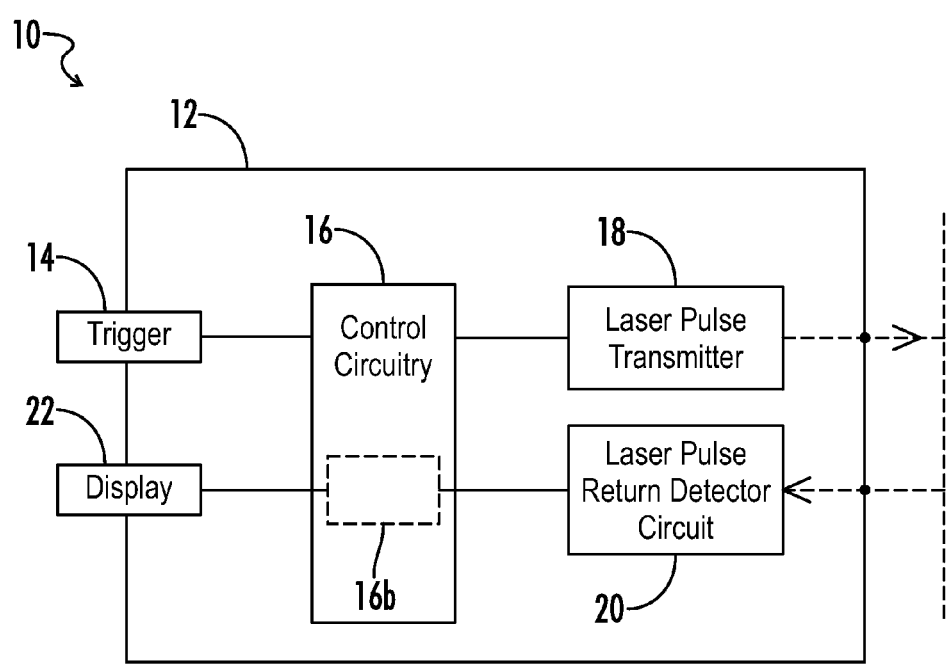
FIG. 1 is a block diagram representing components of a laser distance device according to an exemplary embodiment of the present disclosure.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" may include plural references, and the meaning of "in" may include "in" and "on." The phrase "in one embodiment," as used herein does not necessarily refer to the same embodiment, although it may.

Depending on the embodiment, certain acts, events, or functions of any of the algorithms described herein can be performed in a different sequence, can be added, merged, or left out altogether (e.g., not all described acts or events are necessary for the practice of the algorithm). Moreover, in certain embodiments, acts or events can be performed concurrently, e.g., through multi-threaded processing, interrupt processing, or multiple processors or processor cores or on other parallel architectures, rather than sequentially.

The various illustrative logical blocks and modules described in connection with the embodiments disclosed herein can be implemented or performed by a machine, such as a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor can be a microprocessor, but in the alternative, the processor can be a controller, microcontroller, or state machine, combinations of the same, or the like. A processor can also be implemented as a combination of computing devices, e.g., a combination of a DSP and a microprocessor, a plurality of microprocessors, one or more microprocessors in conjunction with a DSP core, or any other such configuration.

The steps of a method, process, or algorithm described in connection with the embodiments disclosed herein can be embodied directly in hardware, in a software module executed by a processor, or in a combination of the two. A software module can reside in RAM memory, flash memory, ROM memory, EPROM memory, EEPROM memory, registers, hard disk, a removable disk, a CD-ROM, or any other form of computer-readable medium known in the art. An exemplary computer-readable medium can be coupled to the processor such that the processor can read information from, and write information to, the memory/storage medium. In the alternative, the medium can be integral to the processor. The processor and the medium can reside in an ASIC. The ASIC can reside in a user terminal. In the alternative, the processor and the medium can reside as discrete components in a user terminal.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

Referring generally to FIGS. 1-6, various embodiments of a laser distance device and associated circuitry and methods according to the present invention may now be described. Where the various figures may describe embodiments sharing various common elements and features with other embodiments, similar elements and features are given the same reference numerals and redundant description thereof may be omitted below.

An exemplary laser distance device according to various embodiments of the present invention may include without limitation a portable hand-held housing within or about which is disposed a collimated infrared pulsed laser at a nominal pulse repetition rate of several hundred Hertz or lower; a receiving photo detector; circuitry configured to recognize a return pulse from a target and to convert the lapsed time between the transmitted pulse and the received pulse; and a display to show the distance. Such components as discussed previously are well-known and typical to laser rangefinders and the like, and additional components may be contemplated by those of skill in the art within or otherwise without detracting from the scope of the present disclosure.

Figure 6:
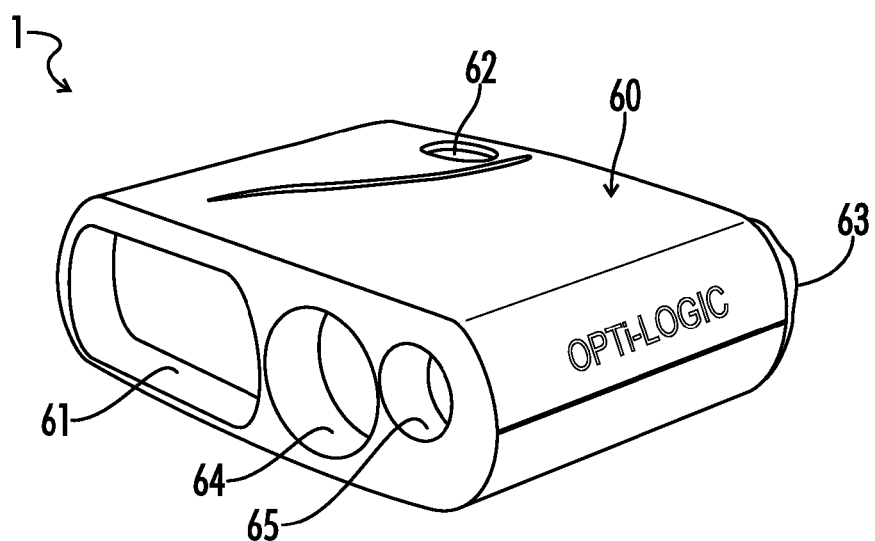
FIG. 6 is an isometric view of an exemplary device of the present disclosure.

While a preferred embodiment of a time-of-flight laser distance device 10 according to the present disclosure, as represented for example in FIG. 6, may include a housing 60 that is suitable for portable use, such as for example handheld and/or battery powered implementations, it may be understood by those of skill in the art that the features and components described herein may more generally apply to instruments as components of a larger system that is not so limited. A laser distance device in such embodiments may generate and transmit data to an external system or other related devices, circuits or sub-systems within a common system, rather than locally displaying the generated data. In either case, data may be locally or externally sent and controlled by various forms of communications devices, components and networks as are known in the art, including but not limited to serial interfaces, Bluetooth, or any direct serial or parallel communications means.

Still referring to the hand-held embodiment as represented in FIG. 6, the device 10 may further include a laser pulse receiving lens 61, a user trigger such as a button 62 to initiate measurements, a transmit lens 64, and first and second ends 63 and 65, respectively, of a superimposed light beam view finder.

Referring now to FIG. 1, internal components of an exemplary laser distance device 10 may further include circuitry 14 coupled to the external user trigger, display circuitry 22, a laser pulse transmitter 18 and a laser pulse return detection circuit 20. Embodiments of a device 10 according to the present disclosure further include return pulse measurement circuitry 16 and associated methods by which features as described herein may be implemented in or by a laser distance device to determine time-of-flight (hereinafter "T.O.F." or "TOF"). A preliminary distance $T_o$ to a target may be first determined based on a linear ramp as a function of a lapsed time from generation of a first laser pulse through an effective time period wherein an associated return pulse is detected. In one particular embodiment, a circuit is provided for conversion of a return pulse to a bipolar signal with a timing point at the positive to negative zero crossing, as well as a high pass timing discriminator, automatic gain controls for constant amplitude signals, and a constant fraction discriminator (CFD) in which the timing point is generated by comparing return pulses.

The return pulse measurement circuitry may be coupled with a machine such as a controller, as previously noted, for the purpose of performing various functions as described herein, but in various embodiments the features described herein may, unless otherwise specifically stated herein, be performed by either or both of the return pulse measurement circuitry and the controller without limitation.

Figure 4A:
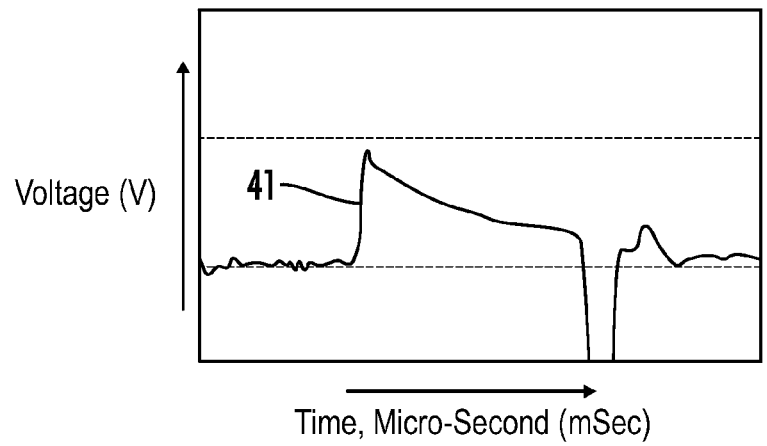
FIG. 4A is a graphical diagram representing exemplary results for a "strong" return pulse signal from a highly reflective target at 71 yards, as provided by an embodiment of a device and method according to the present disclosure.
Figure 4B:
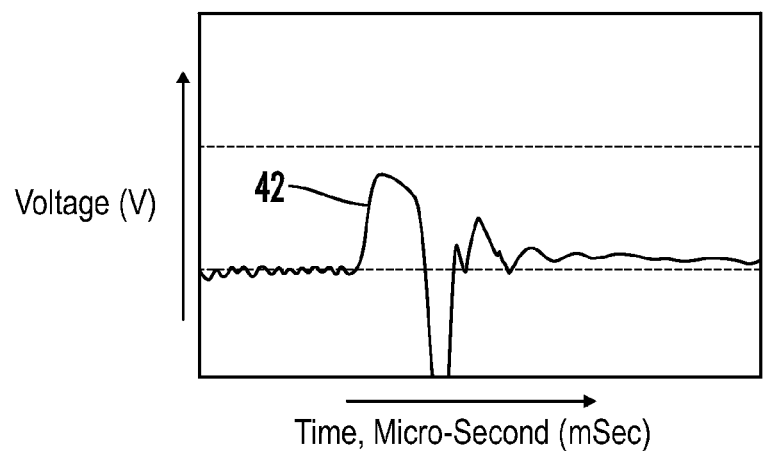
FIG. 4B is a graphical diagram representing exemplary results for a "typical" return pulse signal from a typically reflective target at 71 yards, as provided by an embodiment of a device and method according to the present disclosure.
Figure 4C:
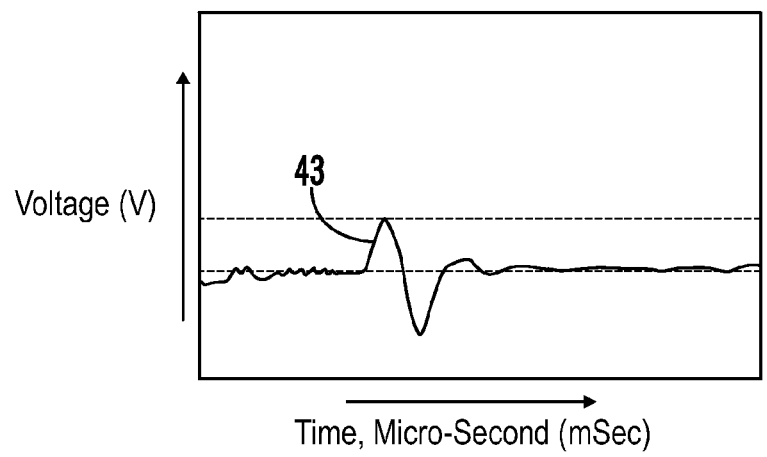
FIG. 4C is a graphical diagram representing exemplary results for a "weak" return pulse signal from a dark target at 71 yards, as provided by an embodiment of a device and method according to the present disclosure.

To illustrate some of the problems that may be presented by targets of varying reflectivity, the return pulses from targets at three different levels of reflectivity at 71 yards are represented in FIGS. 4a, 4b and 4c. It can be seen in FIG. 4a that the leading edge 41 of a strong return pulse signal from a highly reflective target is almost vertical, resulting in almost no walk error and an accurate time-of-flight measurement. FIG. 4b depicts a more typical return pulse signal from a typically reflective target as controlled by the TGC. The leading edge 42 of the pulse has a slope that would result in a moderate walk-error. The leading edge 43 of a weaker return pulse as would be reflected from a dark target as represented in FIG. 4c has a lesser slope which accordingly results in a greater walk error. Embodiments of a device and method as disclosed herein may desirably reduce the walk errors for typical or weak return pulse signals, as described in more detail further below with respect to FIG. 5.

An exemplary technique according to the present disclosure uses multiple comparator fixed trip levels to measure multiple time-of-flight values at those respective levels, and further calculates the leading edge of the return pulse. Several methods may be implemented to correct measurements of the time-of-flight values (i.e., $T_L$ and $T_H$ as implemented below). The simplest but less accurate method is to use two independent analog-to-digital converters (ADC). A more accurate scheme uses a dual ADC, which may be a 12-bit or 16-bit ADC depending on the accuracy requirements of the system. Using such a system, the leading edge of the return pulse may be calculated by measuring the slope and extrapolating the slope origin to the zero crossing point.

In certain embodiments, delays may be added to the return pulses such that only the data received from the lower trip level ADC are used when the data from the higher trip level are present. In other embodiments, multiple or selected trip level data may be used based on other circuitry or requirements.

The controller may in accordance with embodiments of the present disclosure provide a preset signal to clear the ADC prior to each new set of data.

Automatic gain control (AGC) circuitry may in accordance with embodiments of the present disclosure be provided to maintain the return signal levels with, for example, a greatest lower bound and a least upper bound. The bias on an avalanche photodiode may further or in the alternative be implemented to control the gain of the system wherein the signal level remains within the greatest lower bound and the lowest upper bound.

Time gain control (TGC) circuitry or equivalent program logic may be implemented in accordance with embodiments of the present disclosure to increase the amplitude of the return signal level until the upper trip level is obtained and data are recorded from the upper comparator and the lower comparator. At that point, the gain may be reset to zero and again increased until more data are taken. This procedure may optionally be caused to repeat until sufficient data is taken for an appropriate measurement.

A limiting amplifier as is known in the art may be implemented in accordance with embodiments of the present disclosure for preventing excessive overloading by signals of the electronic circuits.

Figure 2:
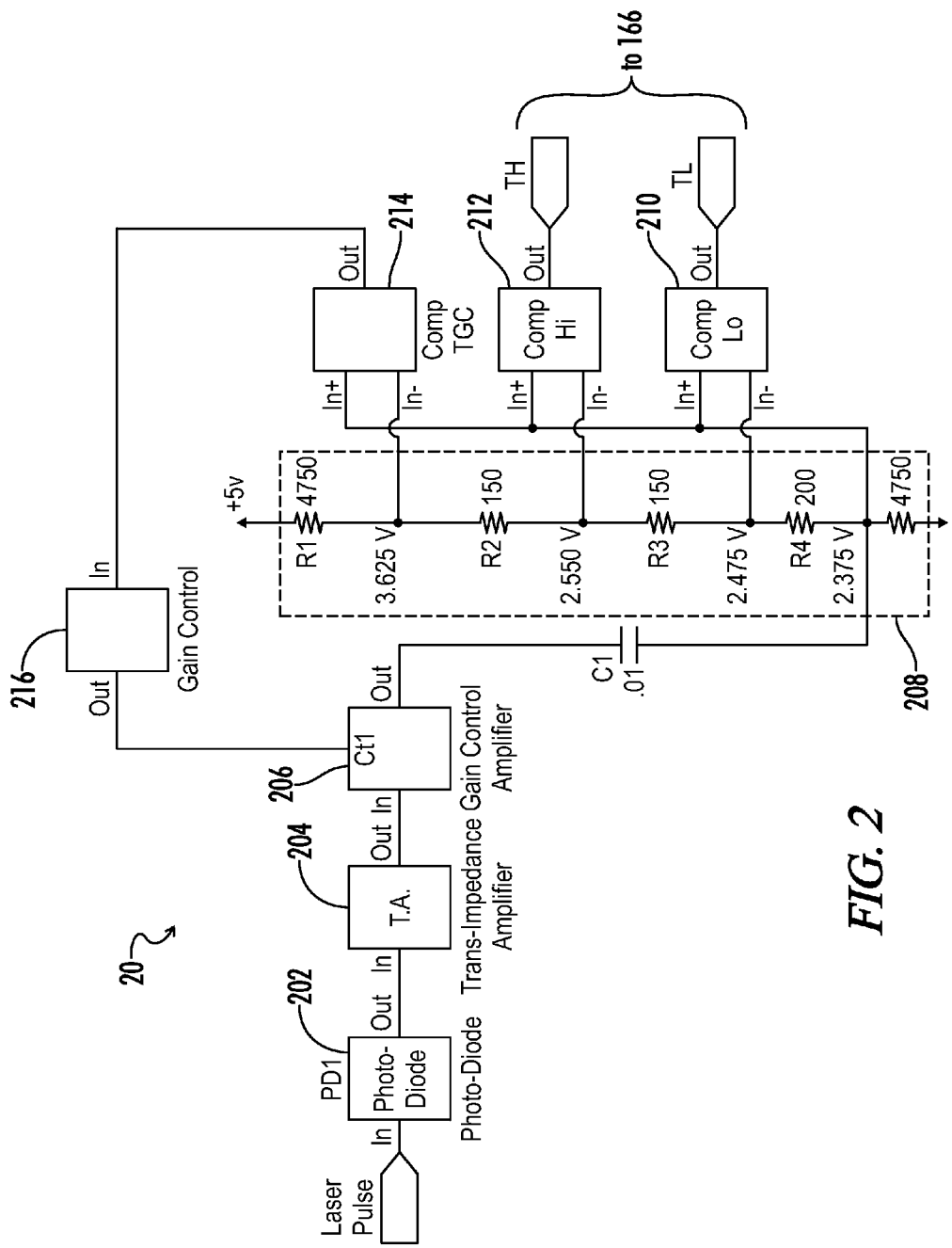
FIG. 2 is a circuit block diagram representing an exemplary embodiment of a return pulse measurement circuit for the device of FIG. 1.

Referring to an exemplary circuit 20 as shown in FIG. 2, a laser return pulse is first received at a photodiode receiver 202 and passed to a transimpedance amplifier 204 which provides a low impedance load for the photodiode and amplifies the current output for input to a gain control amplifier 206. Three high speed comparators 210, 212, 214 are used to measure the leading edge slope of the laser return pulse. The first comparator 210 generates an output at the lowest trip level $V_L$ at a first time-of-flight value $T_L$. The second comparator 212 generates an output at the center trip level $V_H$ at a second time-of-flight value $T_H$. Trip levels $V_L$, $V_H$ are set by resistance values in resistor network 208. A third comparator 214 may be provided to generate an output at the highest trip level $V_{TGC}$ and at the maximum return pulse level allowed by the TGC. This output is generated to gain control circuit 216, an in certain embodiments as described herein may effectively reset the TGC.

By measuring the time-of-flight values $T_L$ and $T_H$, compensation or correction formulae can be applied to adjust walk error to a desired result. For example, the ratio of similar triangles is used to calculate the walk error and adjust the preliminary range measurement $T_o$ for a more accurate distance reading.

The two trip levels, $V_L$ and $V_H$, and the TGC reset level are determined by a resistor string, an example of which is represented in FIG. 2. Since the trip levels $V_L$ and $V_H$ form the vertical side of a triangle with the leading edge of the waveform comprising the hypotenuse, the horizontal sides are $T_L$-$T_o$ and $T_H$-$T_o$ respectively. The ratios at the two triangles are given as:

$$T_L-T_o/V_L = T_H-T_o/V_H$$

or, $t_o = V_H T_L/V_H-V_L - V_L T_H/V_H-V_L$

The leading edge of the return pulse may subsequently be calculated by measuring the slope and further extrapolating the slope origin to the zero crossing point.

Since the electronic paths shown in FIG. 2 are capacitive coupled, the pulse trip levels are set by the differences in the voltages shown:

$$V_L = 2.475 - 2.375 = 100 \text{ mV}$$

$$V_H = 2.550 - 2.375 = 175 \text{ mV}$$

$$V_{tgc} = 2.625 - 2.375 = 250 \text{ mV}$$

The time-of-flight, $t_o$, for the example given is then:

$$t_o = 175/75 T_L - 100/75 T_H = 2.333 T_L - 1.333 T_H$$

Figure 3:
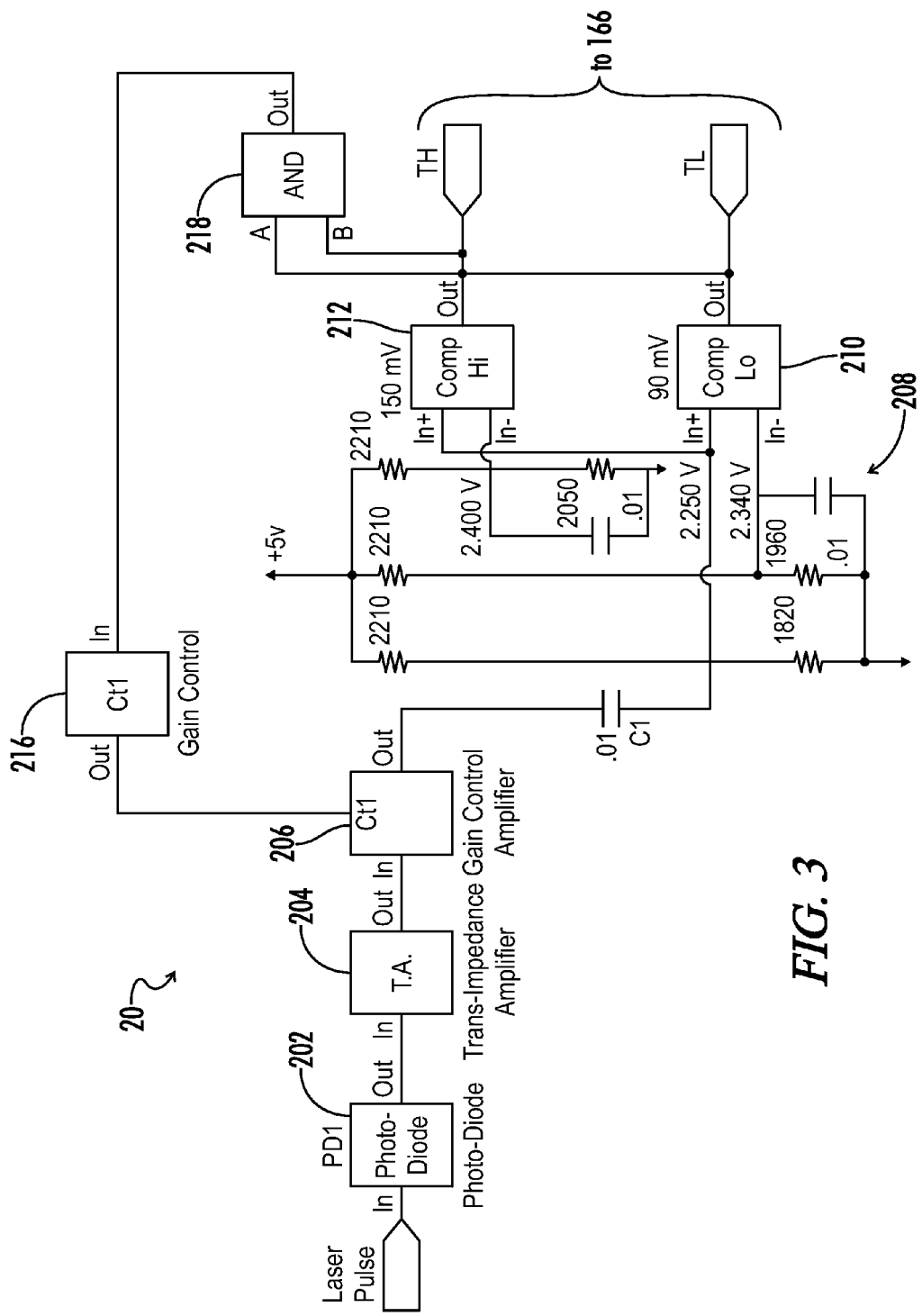
FIG. 3 is a circuit block diagram representing another embodiment of a return pulse measurement circuit for the device of FIG. 1.

Referring to FIG. 3, another embodiment of a return pulse measurement circuit 20 is similar to that represented in FIG. 2, but only includes the first two comparators 210, 212. The outputs from the two comparators 210, 212 are coupled to respective inputs of a logic AND circuit 218, an output for which is coupled to the gain control circuit 216 and indicates when the current return pulse amplitude has exceeded each of trip levels $V_L$ and $V_H$.

Figure 5:
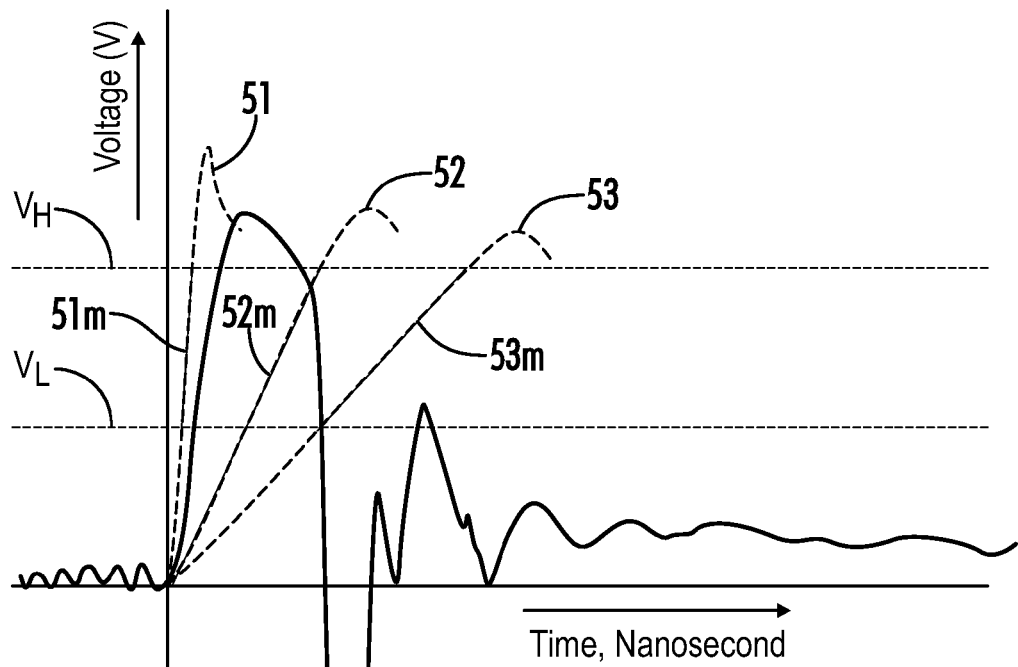
FIG. 5 is a graphical diagram representing exemplary results for each of three different return pulses as provided by an embodiment of a device and method according to the present disclosure.

With reference now to FIG. 5, the time-of-flight $t_o$ was calculated in accordance with a technique of the present disclosure for three different return pulses 51, 52, 53. For illustrative purposes, the return pulses that were subject to these calculations are overlaid with the waveform of a "typical" return pulse as previously referenced from FIG. 4b.

For the first return pulse 51, $T_L$ was measured at 620 nanoseconds and $T_H$ was measured at 635 nanoseconds to yield a corrected time-of-flight $t_o$ of 599.81 nanoseconds, or within the acceptable error for the actual time-of-flight of 600 nanoseconds.

Likewise, for the second return pulse 52, $T_L$ was measured at 675 nanoseconds and $T_H$ was measured at 731 nanoseconds to yield a corrected time-of-flight $t_o$ of 600.13 nanoseconds.

When the pulse rise time is extended, the measurements are not quite as good but are still within an acceptable margin of error as shown in the waveform for the third return pulse 53 when $T_L$ is 750 nanoseconds and $T_H$ is 861 nanoseconds. The corrected time-of-flight $t_o$ is then 601.75 nanoseconds or approximately 602 nanoseconds.

An alternative technique with respect to the dual ADC as described above uses the start/stop features and automatic temperature/voltage correction features of a Time-to-Digital Converter (TDC) system described as follows. The TDC system comprises two independent high-speed counters with programmable start/stop inputs and arithmetic logic units (ALU's) which correct the raw counter readings for any temperature and supply voltage variations. The $T_L$ and $T_H$ TDC counters are simultaneously started via the laser trigger pulse. The $T_L$ and $T_H$ TDC counters are stopped via the $V_L$ and $V_H$ pulse respectively. The $T_L$ and $T_H$ TDC ALU's then correct the raw counter readings and transfer the readings into the TDC output registers. The results can be programmed to be any number of bit integers depending upon the distances to be measured, displayed, stored or sent as an output to another device. In one example, 16-bit integers may be used for distances up to 600 meters or 26-bit integers for distances up to 10 km.

In an embodiment, a laser distance device according to the present disclosure may include avalanche photodiode bias control circuitry for reducing temperature-based error and otherwise increasing accuracy and resolution in measurements, for example in combination with circuits and methods as described above.

Generally stated, the gain of the avalanche photo-detector may be very sensitive to the ambient temperature. If the bias voltage is set too high, the gain will be reduced as the ambient temperature increases and could go into an avalanche breakdown because of too much of a gain increase as the ambient temperature decreases.

In an example of circuitry according to the present disclosure, to insure optimum gain the avalanche bias voltage is controlled with reference to temperature. A temperature circuit takes the input temperature of the environment from a temperature sensor, or equivalent sensor that can be converted to temperature, and applies this value to the bias voltage generation portion of the circuit. This temperature circuit is updated in "real-time," as the temperature sensor output is continuous as long as power is applied. The "real-time" updated bias voltage that is going to the detector is then proportional such that the desired gain of the detector remains constant over any temperature range. The peripheral components in the temperature circuit are specific to the required voltage per degrees Celsius temperature change that the Detector diode requires in order to stay at a constant gain. This voltage per degrees Celsius temperature change was determined through testing on the diodes of the output signal strength with respect to voltage and with respect to temperature.

The previous detailed description has been provided for the purposes of illustration and description. Thus, although there have been described particular embodiments of the present invention, it is not intended that such references be construed as limitations upon the scope of this invention except as set forth in the following claims.

What is claimed is:

1. A time-of-flight laser distance device comprising:
   a laser transmitter effective to generate laser pulses at a selected target;
   a laser pulse return detector circuit effective to receive corresponding laser pulses reflected from the selected target;
   return pulse measurement circuitry comprising at least first and second comparators with respective first and second trip levels, and at least first and second analog-to-digital (ADC) converters corresponding to the at least first and second comparators, respectively,
   the return pulse measurement circuitry further effective to calculate a time-of-flight for a received laser pulse by causing the performance of operations further comprising:
      measuring a preliminary distance to the target based on a linear ramp as a function of a lapsed time from generation of a first laser pulse through an effective time period wherein an associated return pulse is detected, obtaining first and second time-of-flight values associated with a leading edge of the return pulse at each of the first and second trip levels, respectively, determining a time difference between the first and second obtained values, and applying a correction factor with respect to the preliminary measured distance based on the determined time difference.

2. The device of claim 1, wherein the leading edge of the return pulse is calculated by measuring a slope associated with the first and second time-of-flight values and extrapolating an origin of the slope to a zero crossing point.

3. The device of claim 1, the return pulse measurement circuitry further comprising timed-gain control (TGC) circuitry effective to iteratively increase amplitudes for each return pulse signal level until an upper trip level is obtained, after which a gain value is reset.

4. The device of claim 3, the return pulse measurement circuitry further comprising a third comparator having a third trip level corresponding to the upper trip level for the TGC circuitry, the third trip level being higher than the first and second trip levels.

5. The device of claim 1, the return pulse measurement circuitry further comprising gain control circuitry for maintaining return pulse signal levels between a greatest lower bound and a least upper bound.

6. The device of claim 5, the gain control circuitry comprising an avalanche photodiode, the device further comprising a temperature sensor and avalanche photodiode bias control circuitry effective to maintain a bias voltage across a detected temperature range wherein a pulse return detector gain is kept constant.

7. A method of calculating a time-of-flight for a laser pulse generated by a laser distance device and reflected from a selected target, the laser distance device comprising return pulse measurement circuitry further comprising at least first and second comparators with respective first and second trip levels, the method comprising:

measuring a preliminary distance to the target based on a linear ramp as a function of a lapsed time from generation of a first laser pulse through an effective time period wherein an associated return pulse is detected;

obtaining first and second time-of-flight values associated with a leading edge of the return pulse at each of the first and second trip levels, respectively, wherein the leading edge of the return pulse is calculated by measuring a slope associated with the first and second time-of-flight values and extrapolating an origin of the slope to a zero crossing point;

determining a time difference between the first and second obtained values; and applying a correction factor with respect to the preliminary measured distance based on the determined time difference.

8. The method of claim 7, further comprising iteratively increasing amplitudes for each return pulse signal level until an upper trip level is obtained, after which a gain value is reset.

9. The method of claim 7, further comprising maintaining return pulse signal levels between a greatest lower bound and a least upper bound.

10. The method of claim 9, further comprising:

maintaining a bias voltage across a detected temperature range wherein a pulse return detector gain is kept constant.

11. A time-of-flight laser distance device comprising:

a laser transmitter effective to generate laser pulses at a selected target;

a laser pulse return detector circuit effective to receive corresponding laser pulses reflected from the selected target;

return pulse measurement circuitry comprising at least first and second comparators with respective first and second trip levels and a dual ADC converter corresponding to the at least first and second comparators, the return pulse measurement circuitry further effective to calculate a time-of-flight for a received laser pulse by causing the performance of operations further comprising:

measuring a preliminary distance to the target based on a linear ramp as a function of a lapsed time from generation of a first laser pulse through an effective time period wherein an associated return pulse is detected, obtaining first and second time-of-flight values associated with a leading edge of the return pulse at each of the first and second trip levels, respectively, determining a time difference between the first and second obtained values, and applying a correction factor with respect to the preliminary measured distance based on the determined time difference.

12. The device of claim 11, wherein the leading edge of the return pulse is calculated by measuring a slope associated with the first and second time-of-flight values and extrapolating an origin of the slope to a zero crossing point.

13. The device of claim 11, the return pulse measurement circuitry further comprising timed-gain control (TGC) circuitry effective to iteratively increase amplitudes for each return pulse signal level until an upper trip level is obtained, after which a gain value is reset.

14. The device of claim 13, the return pulse measurement circuitry further comprising a third comparator having a third trip level corresponding to the upper trip level for the TGC circuitry, the third trip level being higher than the first and second trip levels.

15. The device of claim 11, the return pulse measurement circuitry further comprising gain control circuitry for maintaining return pulse signal levels between a greatest lower bound and a least upper bound.

16. The device of claim 15, the gain control circuitry comprising an avalanche photodiode, the device further comprising a temperature sensor and avalanche photodiode bias control circuitry effective to maintain a bias voltage across a detected temperature range wherein a pulse return detector gain is kept constant.

* * * * *